United States Patent
Kim

[11] Patent Number: 5,985,758
[45] Date of Patent: Nov. 16, 1999

[54] METHOD FOR FORMING METAL LINES OF SEMICONDUCTOR DEVICES

[75] Inventor: Heon Do Kim, Kyoungki-do, Rep. of Korea

[73] Assignee: Hyundai Electronics Industries Co., Ltd., Ichon-shi, Rep. of Korea

[21] Appl. No.: 08/934,766

[22] Filed: Sep. 22, 1997

[30] Foreign Application Priority Data

Dec. 31, 1996 [KR] Rep. of Korea ........................ 96-79962

[51] Int. Cl.$^6$ ................................................. H01L 21/28
[52] U.S. Cl. ........................ 438/653; 438/632; 438/656; 438/687; 438/688
[58] Field of Search .................................. 438/618, 621, 438/627, 636, 637, 638, 653, 687, 688, 656, 669, 671, 952, 632

[56] References Cited

U.S. PATENT DOCUMENTS

| | | | |
|---|---|---|---|
| 4,988,423 | 1/1991 | Yamamoto et al. | 438/625 |
| 5,266,521 | 11/1993 | Lee et al. | 438/643 |
| 5,412,250 | 5/1995 | Brugge | 257/750 |
| 5,447,599 | 9/1995 | Li et al. | 216/17 |
| 5,572,071 | 11/1996 | Lee | 257/751 |
| 5,670,420 | 9/1997 | Choi | 438/643 |

FOREIGN PATENT DOCUMENTS

| | | | |
|---|---|---|---|
| 1-5035 | 1/1989 | Japan | 438/FOR 357 |
| 5-129297 | 5/1993 | Japan | 438/FOR 354 |

*Primary Examiner*—T. N. Quach
*Attorney, Agent, or Firm*—Thelen Reid & Priest LLP

[57] ABSTRACT

A method for forming metal lines of a semiconductor device, which is capable of eliminating a problem in the planarization caused by the chemical vapor deposition method, namely, the formation of a thin film having a rough surface, an increase in the impurity concentration and an influence on an under layer. The method includes the steps of depositing an anti-diffusion metal layer over a structure formed with a metal contact, depositing a metal layer such as a copper film or aluminum film over the anti-diffusion metal layer in accordance with a physical vapor deposition method, annealing the resulting structure in a chamber maintained at a high temperature and high vacuum without losing the vacuum, thereby planarizing the structure. The method further includes forming an anti-reflection film over the metal layer, patterning the anti-reflection film, the metal layer and the first anti-diffusion film, thereby forming an anti-reflection film pattern, a metal layer pattern, and a first anti-diffusion film pattern that form a line; and forming a second anti-diffusion film on an exposed surface of the anti-reflection film pattern, the metal and the first anti-diffusion film pattern.

20 Claims, 2 Drawing Sheets

METHOD FOR FORMING METAL LINES OF SEMICONDUCTOR DEVICES

BACKGROUND OF THE INVENTION

1. Field of the Invention

The present invention relates to a method for forming metal lines of a semiconductor device, and more particularly to a method for forming metal lines of a highly integrated semiconductor device.

2. Description of the Prior Art

Generally, previously known copper line polarization methods utilize the chemical vapor deposition method. Since there is no precursor concretely defined for these methods, a number of research efforts are being made in association with the methods.

A thin film deposited according to the chemical vapor deposition method typically has a rough surface. As a result, It is impossible to directly form lines on such a thin film.

Accordingly, the line formation can be carried out after the rough thin film is processed by a polishing process, for example, a chemical mechanical polishing (CMP) process.

Furthermore, where lines of a semiconductor device are comprised of a copper thin film, a degradation in the reliability occurs because the copper thin film contains several percentages of impurity gas. In this case, a deposition device having a complex configuration should also be used.

SUMMARY OF THE INVENTION

Therefore, an object of the invention is to solve the above-mentioned problems involved in the prior art and to provide a method for forming metal lines of a semiconductor device, which is capable of achieving an easy metal line formation while achieving a superior reproducibility.

One object of the invention is to provide a method for forming metal lines of a semiconductor device, wherein a metal layer deposited over an under layer to planarize the under layer is made of a material exhibiting a low dependency on the underlayer.

Another object of the invention is to provide a method for forming metal lines of a semiconductor device, which is capable of eliminating a problem in the planarization caused by the chemical vapor deposition method, namely, the formation of a thin film having a rough surface, an increase in the impurity concentration and an influence on an under layer.

Yet another object of the invention is to provide a method for forming metal lines of a semiconductor device, wherein an anti-diffusion film is formed over metal lines by a selective chemical vapor deposition method, thereby preventing a surface diffusion in the metal lines.

One aspect of the present invention provides a method for forming metal lines of a semiconductor device, comprising the steps of: providing a semiconductor substrate; forming an insulating film having a contact hole over a semiconductor substrate; forming a first anti-diffusion film on an exposed surface of the insulating film in such a manner that the first anti-diffusion film covers the contact hole; forming a metal layer over the first anti-diffusion film by a physical vapor deposition process; forming an anti-reflection film over the metal layer; annealing the resulting structure obtained after the formation of the anti-reflection film, thereby planarizing the structure; patterning the anti-reflection film, the metal layer and the first anti-diffusion film, thereby forming a line; and selectively forming a second anti-diffusion film on an exposed surface of the line.

Another aspect of the present invention provides a method for forming metal lines of a semiconductor device, comprising the steps of: providing a semiconductor substrate; forming an insulating film having a contact hole over a semiconductor substrate; forming a first anti-diffusion film on an exposed surface of the insulating film in such a manner that the first anti-diffusion film covers the contact hole; sequentially depositing a first copper film and a second copper film over the first anti-diffusion film by a physical vapor deposition process; forming an anti-reflection film over the second copper film; annealing the resulting structure obtained after the formation of the anti-reflection film, thereby planarizing the structure; patterning the anti-reflection film, the second copper film, the first copper film and the first anti-diffusion film, thereby forming a line; and selectively forming a second anti-diffusion film on an exposed surface of the line.

Yet another aspect of the present invention provides a method for forming metal lines of a semiconductor device, comprising the steps of: providing a semiconductor substrate; forming an insulating film having a contact hole over a semiconductor substrate; forming a first anti-diffusion film on an exposed surface of the insulating film in such a manner that the first anti-diffusion film covers the contact hole; forming an aluminum alloy layer over the first anti-diffusion film by a physical vapor deposition process; forming an anti-reflection film over the aluminum alloy layer; annealing the resulting structure obtained after the formation of the anti-reflection film, thereby planarizing the structure; patterning the anti-reflection film, the aluminum alloy layer and the first anti-diffusion film, thereby forming a line; and selectively forming a second anti-diffusion film on an exposed surface of the line.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 6 illustrate sequential steps of a method for forming metal lines of a semiconductor device in accordance with the present invention, respectively.

Figure 1:
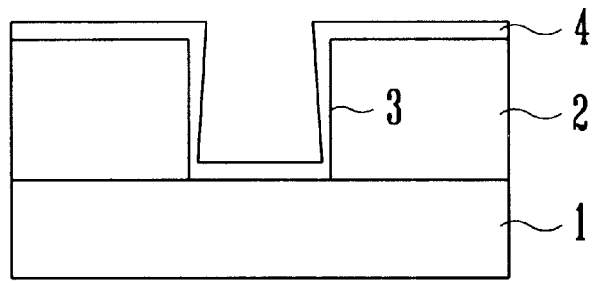
FIGS. 1 to 6 are sectional views respectively illustrating sequential steps of a method for forming metal lines of a semiconductor device in accordance with the present invention.

In accordance with the method of the present invention, an insulating film 2 is first formed over a silicon substrate 1 or other conductive layer, as shown in FIG. 1.

Thereafter, the insulating film 2 is selectively removed at its portion corresponding to a metal contact region, thereby forming a contact hole 3.

A natural oxide film (not shown) formed on the bottom of the contact hole 3 is then removed. Over the entire exposed surface of the resulting structure, a first anti-diffusion film 4 made of a silinitride-based alloy such as Ta/TaSiN or W/WSiN is deposited. The deposition of the first anti-diffusion film 4 may be carried out by a physical vapor deposition method or a chemical vapor deposition method.

Figure 2:
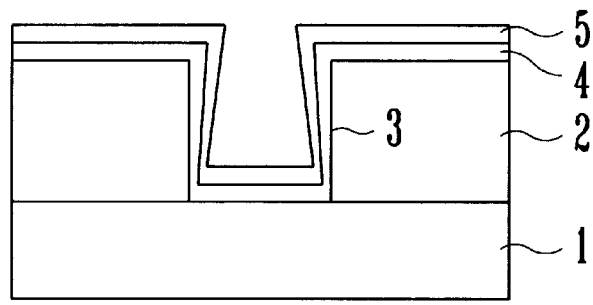

A post-treating process is then carried out to obtain an improvement in the performance of the first anti-diffusion film 4, as shown in FIG. 2. Subsequently, a first copper film 5 is uniformly deposited over the first anti-diffusion film 4 in a sputtering device.

The deposition of the first copper film 5 is carried out at a temperature of about 20 to 100° C. using deposition power of 10 to 100 kW under the condition in which the thickness of the first copper film 5 does not exceed 50% of a predetermined thickness of the overall copper film.

Figure 3:
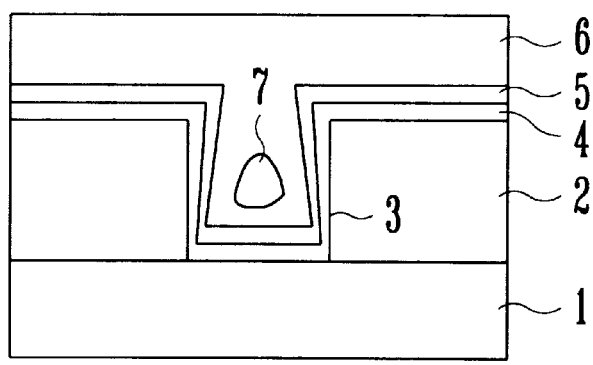

A second copper film 6 is then deposited over the first copper film 5 in the same deposition chamber or in another deposition chamber after being moved to the latter deposition chamber under the condition in which the deposition chamber is maintained at a high temperature and high vacuum, as shown in FIG. 3.

The deposition of the second copper film 6 is carried out at a temperature of about 400 to 650° C. using relatively low deposition power of 1 to 5 kW. Although the second copper film 6 deposited over the contact hole 3 provides a planarized upper surface, it may have voids 8 within the contact hole 3.

Figure 4:
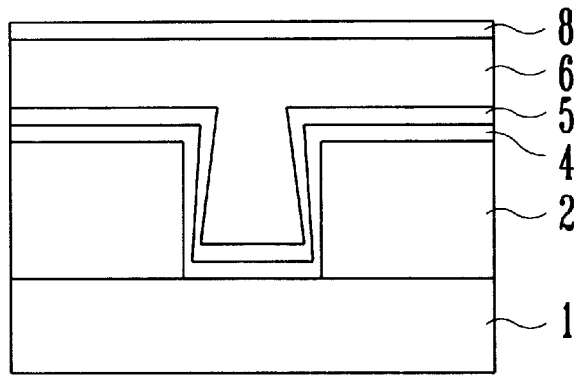

After the deposition of the second copper film 6, the resulting structure is annealed at a temperature of about 650 to 800° C. or above for several minutes in the deposition chamber maintained at a high temperature and high vacuum without a movement of the wafer under the condition in which argon or hydrogen gas is introduced in the deposition chamber. After the annealing, the voids 8 existing within the contact hole 3 are removed, as shown in FIG. 4. Accordingly, a complete planarization is obtained.

An anti-reflection film 8 is then deposited over the second copper film 6 for the formation of a line.

Figure 5:
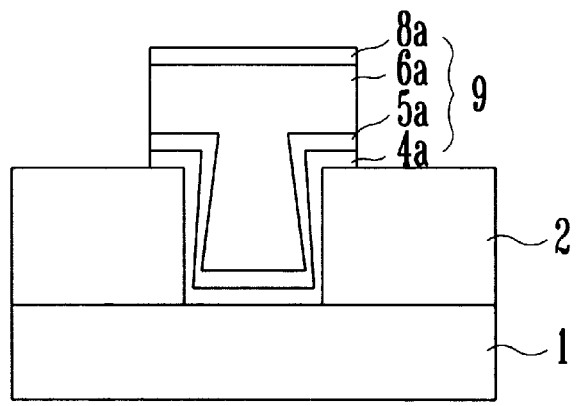

Thereafter, the anti-reflection film 8, second copper film 6, first copper film 5 and first anti-diffusion film 4 are selectively removed by an etch process using a line mask, thereby forming an anti-reflection film pattern 8a, a second-copper film pattern 6a, a first-copper film pattern 5a, and a first-anti-diffusion film pattern 4a, as shown in FIG. 5.

These anti-reflection film pattern 8a, second-copper film pattern 6a, first-copper film pattern 5a, and first-anti-diffusion film pattern 4a constitute a metal line 9.

Figure 6:
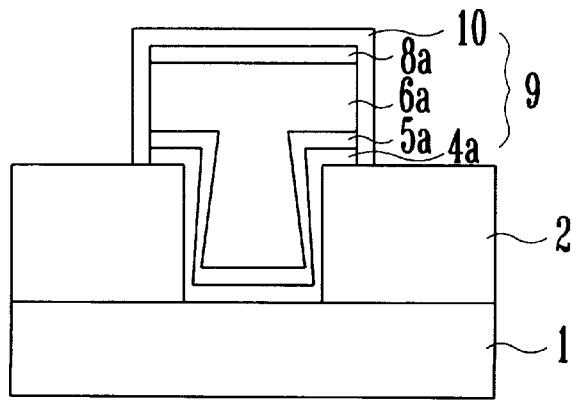

After the formation of the metal line 9, a second anti-diffusion film 10 is deposited to a thickness of about 100 to 500 Å over the exposed surface of the metal line 9 in accordance with a selective chemical vapor deposition method, so as to protect side surfaces of the metal line 9. The deposition of the second anti-diffusion film 10 is shown in FIG. 6.

Since the second anti-diffusion film 10 is deposited only on the side and upper surfaces of the metal line 9, it is possible to prevent a copper diffusion.

As apparent from the above description, the method for forming metal lines in accordance with the present invention provides various effects, as follows.

The important factor of a degraded line is a surface diffusion in the line. In accordance with the method of the present invention, such a surface diffusion in the line is inhibited by an anti-diffusion film formed on the side walls of the line. Accordingly, it is possible to enhance the reliability of the line not only in the case of copper lines, but also in the case of general metal lines, for example, aluminum lines.

Where an aluminum alloy is used as a base metal for metal lines, a double-step deposition process or reflow process may be used in accordance with the method of the present invention in order to fill a contact hole without forming voids in the contact hole.

In accordance with the method of the present invention, it is possible to form metal lines by a sputtering device using the physical vapor deposition method which is mainly used for mass production. The protective film for the side walls of the line may be formed in accordance with the selective chemical vapor deposition method after the formation of the line. Accordingly, it is possible to achieve a planarization of the copper film without using the CMP process.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming metal lines of a semiconductor device, the method comprising:

providing a semiconductor substrate;

forming an insulating film having a contact hole over the semiconductor substrate;

forming a first anti-diffusion film on an exposed surface of the insulating film in such a manner that the first anti-diffusion film covers the contact hole;

forming a metal layer over the first anti-diffusion film by a physical vapor deposition process;

annealing a resulting structure that is obtained after the formation of the metal layer, thereby planarizing the structure;

forming an anti-reflection film over the metal layer;

patterning the anti-reflection film, the metal layer and the first anti-diffusion film, thereby forming an anti-reflection film pattern, a metal layer pattern and a first anti-diffusion film pattern that form a line; and forming a second anti-diffusion film on an exposed surface of the anti-reflection film pattern, the metal layer pattern and the first anti-diffusion film pattern.

2. The method in accordance with claim 1, wherein:

the metal layer includes a material selected from a group consisting of copper and aluminum.

3. The method in accordance with claim 2, wherein:

the metal layer is formed by a double-step deposition process or a reflow process in such a manner that it fills the contact hole without forming voids in the contact hole.

4. The method in accordance with claim 1, wherein the annealing step is carried out:

at a temperature of about 500 to 800° C.

in an inert gas or hydrogen atmosphere without losing vacuum.

5. The method in accordance with claim 1, wherein:

the second anti-diffusion film is deposited to a thickness of about 500 Å or less in accordance with a selective chemical vapor deposition process.

6. A method for forming metal lines of a semiconductor device, the method comprising:

providing a semiconductor substrate;

forming an insulating film having a contact hole over the semiconductor substrate;

forming a first anti-diffusion film on an exposed surface of the insulating film in such a manner that the first anti-diffusion film covers the contact hole;

sequentially depositing a first copper film and a second copper film over the first anti-diffusion film by a physical vapor deposition process;

annealing a resulting structure obtained after the formation of the first copper film and the second copper film, thereby planarizing the structure;

forming an anti-reflection film over the second copper film;

patterning the anti-reflection film, the second copper film, the first copper film and the first anti-diffusion film, thereby forming an anti-reflection film pattern, a second copper film pattern, a first copper film pattern and a first anti-diffusion film pattern that form a line; and forming a second anti-diffusion film on an exposed surface of the the anti-reflection film pattern, the second copper film pattern, the first copper film pattern and the first anti-diffusion film pattern.

7. The method in accordance with claim 6, wherein:
the first and second anti-diffusion films are made of a silinitride-based alloy including Ta and TaSiN or W and WSiN.

8. The method in accordance with claim 7, wherein:
the TaSiN and WSiN have an amorphous characteristic.

9. The method in accordance with claim 6, wherein:
the first copper film is deposited at a temperature of about 20 to 100° C. using a deposition power of 10 to 100 kW.

10. The method in accordance with claim 6, wherein:
the second copper film is deposited at a temperature of about 400 to 600° C. using a deposition power of about 1 to 5 kW.

11. The method in accordance with claim 6, wherein:
the deposition of the second copper film is carried out in the same deposition chamber as the for the first copper film or in a deposition chamber different from that for the first copper film.

12. The method in accordance with claim 6, wherein the annealing step is carried out:
at a temperature of about 500 to 800° C.
in an inert gas or hydrogen atmosphere
without losing vacuum.

13. The method in accordance with claim 6, wherein the first anti-diffusion film is deposited by:
a physical vapor deposition method; or
a chemical vapor deposition method.

14. The method in accordance with claim 6, further comprising:
removing a natural oxide film formed on the bottom of the contact hole after the formation of the contact hole.

15. The method in accordance with claim 6, wherein:
the second anti-diffusion film is deposited to a thickness of about 500 Å or less.

16. A method for forming metal lines of a semiconductor device, the method comprising:
providing a semiconductor substrate;

forming an insulating film having a contact hole over the semiconductor substrate;

forming a first anti-diffusion film on an exposed surface of the insulating film in such a manner that the first anti-diffusion film covers the contact hole;

forming an aluminum alloy layer over the first anti-diffusion film by a physical vapor deposition process;

annealing a resulting structure obtained after the formation of the aluminum alloy layer thereby planarizing the structure;

an anti-reflection film over the aluminum alloy layer;

patterning the anti-reflection film, the aluminum alloy layer and the first anti-diffusion film, thereby forming an anti-reflection film pattern, an aluminum alloy layer pattern and a first anti-diffusion film pattern that form a line; and selectively forming a second anti-diffusion film on an exposed surface of the the anti-reflection film pattern, the aluminum alloy layer pattern and the first anti-diffusion film pattern.

17. The method in accordance with claim 16, wherein:
the aluminum alloy layer is formed by a double-step deposition process or a reflow process in such a manner that it fills the contact hole without forming voids in the contact hole.

18. The method in accordance with claim 16, wherein the annealing step is carried out:
at a temperature of about 500 to 800° C.
in an inert gas or hydrogen atmosphere
without losing vacuum.

19. The method in accordance with claim 16, wherein the first anti-diffusion film is deposited by:
a physical vapor deposition method; or
a chemical vapor deposition method.

20. The method in accordance with claim 16, wherein:
the second anti-diffusion film is deposited to a thickness of about 500 Å or less.

* * * * *